(12) United States Patent
Ye et al.

(10) Patent No.: US 9,928,286 B2
(45) Date of Patent: *Mar. 27, 2018

(54) TRANSFORMING CHARACTER DELIMITED VALUES

(71) Applicant: eBay Inc., San Jose, CA (US)

(72) Inventors: Gang Ye, Sunnyvale, CA (US); Thennarasu Ponnusamy, Sunnyvale, CA (US); Belinda Liu, Saratoga, CA (US); Enlin Wang, San Jose, CA (US); Mallikarjun Bhaigond, San Jose, CA (US); Amit Desai, Fremont, CA (US); Xin Zhuang, Fremont, CA (US); Preeta Joshi, Sunnyvale, CA (US); Hong-Yen Nguyen, Carlsbad, CA (US)

(73) Assignee: eBay Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/478,814

(22) Filed: Apr. 4, 2017

(65) Prior Publication Data

US 2017/0206262 A1 Jul. 20, 2017

Related U.S. Application Data

(63) Continuation of application No. 14/576,969, filed on Dec. 19, 2014, now Pat. No. 9,619,152.

(51) Int. Cl.
*H03M 5/00* (2006.01)
*G06F 17/30* (2006.01)

(52) U.S. Cl.
CPC .............................. *G06F 17/30575* (2013.01)

(58) Field of Classification Search
CPC .... G06F 3/0608; G06F 3/0673; G06F 3/0661; G06F 3/064; G06F 5/00; G03M 5/00; H03M 7/00
USPC ................................................ 341/55, 50, 51
See application file for complete search history.

(56) References Cited

U.S. PATENT DOCUMENTS

| | | | |
|---|---|---|---|
| 5,268,856 A | 12/1993 | Wilson | |
| 8,547,760 B2 | 10/2013 | Jenkins | |
| 8,812,768 B2 * | 8/2014 | Przybylski | G06F 13/4243 711/103 |
| 9,619,152 B2 | 4/2017 | Ye et al. | |
| 2014/0379979 A1 | 12/2014 | Jenkins et al. | |
| 2016/0179397 A1 | 6/2016 | Ye et al. | |

OTHER PUBLICATIONS

"U.S. Appl. No. 14/576,969, Notice of Allowance dated Jan. 28, 2016", 9 pgs.

* cited by examiner

*Primary Examiner* — Jean B Jeanglaude

(74) *Attorney, Agent, or Firm* — Schwegman Lundberg & Woessner, P.A.

(57) ABSTRACT

Techniques for transforming character delimited values are presented herein. An input module is configured to read a set of character delimited values. A generation module is configured to generate a synchronization block for the set of values that includes a value selected from a byte size of the associated value and may be a flag representing a predetermined value. An output module is configured to output the synchronization block and the set of values to a binary data output stream for output in a device dependent byte order according to the respective byte sizes of the values in the set of values.

20 Claims, 10 Drawing Sheets

TRANSFORMING CHARACTER DELIMITED VALUES

PRIORITY

This application is a continuation of and claims the benefit of priority to U.S. patent application Ser. No. 14/576,969, entitled "TRANSFORMING CHARACTER DELIMITED VALUES," filed on Dec. 19, 2014, which is hereby incorporated by reference herein in its entirety.

TECHNICAL FIELD

The subject matter disclosed herein generally relates to the technical field of data processing and more specifically relates to transforming character delimited values.

BACKGROUND

Modern technology offers data storage systems that store massive amounts of data in many different formats. Databases, data servers, and other devices store data that represents nearly every facet of digital society. One prevalent format includes character delimited values files. For example, a text file may include many rows of data where each row includes a set of values delimited or separated by commas, or another character. Such a file format may be easier for a human to read and may provide a standard data format, making migration from one data storage system to another less complex.

However, a character delimited data file suffers from several drawbacks. First, such a file is not well compressed causing the data to occupy more storage space than necessary. Of course, such a file may be compressed to reduce storage space; however, the file generally would need to be uncompressed in order to access values stored in the file.

Second, because varying values occupy different lengths in the data file, data values would generally need to be read in order to access certain values. For example, in order to determine the $10^{th}$ value, the previous nine values would generally need to be read. Furthermore, in order to read a value in the $100^{th}$ row, the previous 99 rows would generally need to be read by a data processing system. Therefore, accessing data in a character delimited value file is much slower than other, more native formats.

BRIEF DESCRIPTION OF THE DRAWINGS

Some embodiments are illustrated by way of example and not limitation in the figures of the accompanying drawings.

DETAILED DESCRIPTION

Figure 1:
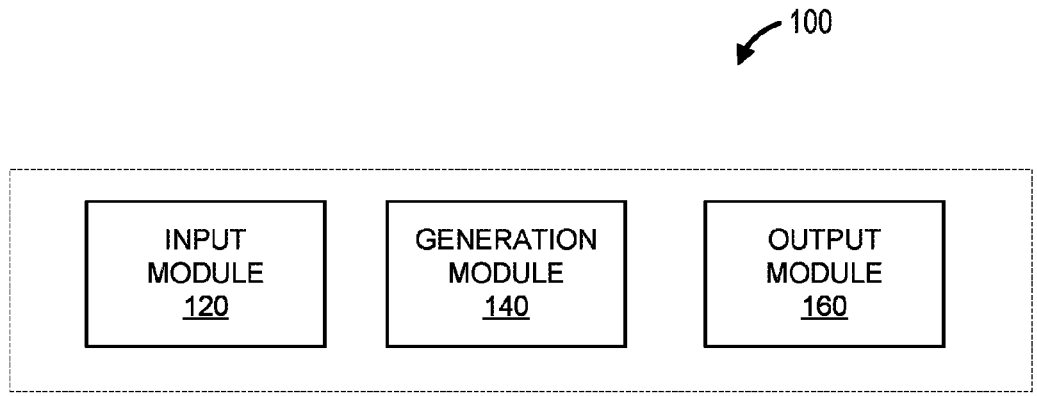
FIG. 1 is a block diagram illustrating a system for transforming character delimited values, in accordance with an example embodiment.

The description that follows includes illustrative systems, methods, techniques, instruction sequences, and computing machine program products that embody illustrative embodiments. In the following description, for purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques have not been shown in detail.

Example systems and methods are presented for transforming character delimited values. According to embodiments described herein, such a transformation accomplishes both compression of the values and increased access speed. In certain embodiments, a system may read a set of values from a character delimited value file, a database, or a network storage system. In one example, the character delimited values are stored in a comma-delimited value file.

As part of the transformation, the system may generate, in near real-time, a synchronization block that precedes the values in the output and describes the values. For each of the values, the synchronization block either stores a byte size for the value, or a flag that indicates the value is a predetermined value. In one example, the synchronization block indicates a number of bytes required to store the value. In another example, where the value matches a predetermined value or a value from a previous set of values, the synchronization block indicates a flag to identify the value.

In the example, where the value matches a pre-defined value, instead of storing the size of the value in the synchronization block, the system stores a flag representing the predefined value. In this case, because the flag indicates the value, the actual value is not included in the output set of values. Similarly, in the case when the value matches a value from an immediately preceding value set, the synchronization block may store a flag representing the preceding value. Therefore, the actual value need not be stored in the output set of values. Because values, in certain examples, are indicated in the synchronization block instead of in the set of values, the number of actual values being stored is reduced. This both decreases storage requirements for the values and decreases access time for the values.

The transformation addresses the drawbacks of using a character delimited value file. The transformation provides binary performance based on the text format of a character delimited value file. The transformation also facilitates migrating data from one storage system to another using a standard data format because most, if not all, data storage systems are capable of working with character delimited value files. Second, massive amounts of data may be stored and accessed much more quickly than with currently available formats.

Another benefit is that according to the transformation, values in the file may be stored in a binary format in a device dependent byte order. This allows a storage system to read/write values one value at a time without considering byte order. Therefore, the storage system may write four bytes in one operation capable of representing an integer value up to 4,294,967,295 (or 4294967295). Prior to the transformation, the same value would occupy up to 13 bytes in the character delimited value file. Furthermore, because the value is stored in a device dependent byte order, the value may also be read in one operation, whereas reading the character delimited value may cost up to 13 byte read operations to determine the value.

In another benefit, the synchronization block may store a flag representing a predetermined value. For example, where a set of data includes many values that are repeated (e.g., zero, one, or other number), the synchronization block may include a value in the flag that represents the value so that the value no longer needs to be stored in the set of values. For example, where a particular value in a set of values equals 99,999, a generation module may associate a flag of nine with the particular value. In this example, for each value that equals 99,999 in the set of values, the associated flag will equal nine.

A particular benefit of storing predefined values in the synchronization block includes not storing the value in the set of values. This greatly reduces the amount of storage space needed to store the transformed character delimited values. Another benefit is that looking up values in the transformed data is accomplished more quickly because some values may be determined after reading the synchronization block without requiring a system to read the actual values.

FIG. 1 is a block diagram illustrating a system 100 for transforming character delimited values, in accordance with an example embodiment. In one embodiment, the system 100 may include an input module 120, a generation module 140, and an output module 160.

According to one embodiment, the input module 120 may be configured to read a set of character delimited values. The input module 120 may receive character delimited values from a wide variety of sources as will be described in FIG. 2. In one example, the input module 120 may read sets of values from a comma-separated value (CSV) file, wherein each row in the CSV file includes a set of values. Therefore, character delimited values may include character separated values.

In one embodiment, the generation module 140 may be configured to generate, in near real-time and for each set of input values, a synchronization block for the set of values. A synchronization block, as described herein, includes nibbles (4 bits) for each of the values received in the input stream. As one skilled in the art may appreciate and as used herein, a nibble is one half of one byte, or four bits. A signed nibble may represent a value from −8 to 7, and an unsigned nibble may represent values from 0 to 15.

As described herein, real-time generation of a synchronization block may include generating the synchronization block immediately after receiving the input stream that includes a set of values. Because a system as described herein may transform hundreds of millions of sets of values sequentially, the system may generate synchronization blocks for respective set of values while receiving additional values from the input stream. Therefore, in one example, real-time generation may also include generating respective synchronization blocks concurrently with receiving additional set of values.

The nibbles in one example embodiment indicate how many bytes are needed to store the value being represented or is a special code that is interpreted in a particular way. For example, in response to a value being less than 256, the generation module 140 may determine that the nibble is one because a single byte may store the value. In another example, the value may be 999,999,999 and the generation module 140 may determine that the nibble is four because four bytes are needed to store the value 999,999,999.

In another example embodiment, the value may include a string. For example, the value may be the string "empty value." In this example, the nibble may be a predetermined value that indicates a string. In one example, the nibble value may be 0x0D. Accordingly, the generation module 140 may represent the string in the set of values using a first byte to indicate the size of the string, then subsequent bytes to store the characters of the string.

In one non-limiting example, the string may be "empty value." The generation module 140 may use the 0x0D predetermined flag in the synchronization block, and represent the string in the set of values using a first byte value of 11 (the length of the string), the subsequently the bytes values representing the string literals (e.g. 'e' 'm' 'p' 't' 'y' ' ' 's' 't' 'r' 'i' 'n' 'g').

In another example embodiment, the value may include a much longer string, such as a paragraph, or other composition that includes more than 255 characters (a number of characters that cannot be represented using one byte). In this example, the nibble value may be a predetermined value that indicates a "long string." For example, the predetermine nibble for the long string is 0x0E. The generation module 140 may represent the string in the set of values using two bytes to indicate the size of the string, then include the characters literals of the string in the output stream. For example, the string may include 2000 characters. Accordingly, the generation module may include a nibble value of 0x0E in the synchronization block, a (two byte) value of 0x07D0 in the set of values, and then the string literals in the set of values. Using two bytes in the set of values to represent the size of the string allows a string of 65,536 characters to be stored in the set of values. Of course, one skilled in the art may recognize other nibble values for representing longer strings and this disclosure is not limited in this regard.

In another embodiment, the generation module 140 may end the synchronization block with a boundary nibble. For example, the generation module 140 may append the synchronization block with a boundary nibble that represents the end of the synchronization block. Therefore, the boundary nibble may provide a boundary between the synchronization block and the associated set of values. Providing such a boundary may inform a device reading the synchronization block when the synchronization block is at an end and where actual values begin. In one example, the value of the nibble may be a predetermined value such as, but not limited to, 15 (0xF). Of course, other values may be used, and this disclosure is not limited in this regard.

In another embodiment, the generation module 140 may include a filler nibble in response to the number of nibbles for the synchronization block and the boundary nibble being an odd number. For example, where a synchronization block includes six nibbles and the boundary nibble is one nibble, the generation module 140 may include a filler nibble after values in the synchronization block but before a boundary nibble. Adding a filler nibble in this manner ensures that the size of the synchronization block, filler nibble, and boundary nibble add to an even number of nibbles and therefore, an integer number of bytes.

Including a filler nibble may ensure that values included in the synchronization block and values included in the set of values are byte aligned. Values that are byte aligned may be more quickly read by a device reading the synchronization block and/or the set of values. Therefore, in one example, a synchronization block may end with a byte value of 15 (0x0F), which represents a filler nibble with a value of zero (0x0) and a boundary nibble with a value of 15 (0xF). In another example, the generation module 140 may end the synchronization block with a byte value of 0xF0 which represents the boundary nibble before the filler nibble.

In another embodiment, the nibble in a synchronization block may include a predetermined flag. In one embodiment, the flag may represent the corresponding value in the set of values. For example, the flag may be zero, which indicates that the corresponding value in the set of values is also zero.

In another embodiment, the flag may be a predetermined value. For example in response to the set of values including many identical values, the generation module 140 may determine that the flag may be used to represent the many identical values. For example, where a set of values includes many values that equal 45854, the generation module 140 may determine a flag to represent the values that equal 45854. In one example, the generation module 140 may select a predetermined value as nine (0x9). Therefore, for each value in the set of values that equals 45854, the generation module 140 may include the flag of nine (0x9) instead of a byte size of the value.

Furthermore, because the predetermined flag represents a specific value in the set of values, values in the set of values that are equal to the represented value may no longer be included in the set of values. This further decreases a size requirement for storing the synchronization block and the set of values. Also, using a predetermined flag in this manner decreases access time for values in the set of values because a reading device needs only to read the synchronization block.

In another example, the predetermined value may indicate that the associated value in the set of values is a repeated value from an immediately previous set of values. A predetermined flag may be six (0x6) to indicate that the associated value is a repeat of a previous set. Of course, any value may be used, and this disclosure is not limited in this regard. For example, where the fourth value in an immediately previous set of values was 8,456,123, in response to the fourth value in a current set of values being 8,456,123 the generation module 140 may set the nibble representing the fourth value to six (0x6).

Furthermore, because the predetermined flag represents the repeated value in the set of values, the value that is repeated may no longer be included in the set of values. This further decreases a size requirement for storing the synchronization block and the set of values and decreases access time for values in the set of values because the reading device need only read the synchronization block to determine the repeated value.

In another embodiment, the generation module 140 may cache the synchronization block. The generation module 140 may store a list or a set of previously generated synchronization blocks for previous sets of values. In response to the current synchronization block matching a synchronization block in the cache, the generation module 140 may include an index to the cache of synchronization blocks instead of the full synchronization block. This may further decrease storage requirements for the transformed delimited values.

In one embodiment, the output module 160 may be configured to sequentially output the synchronization block and the values to a binary output stream. In one example, the binary output stream may include the synchronization block and then the set of values. The binary output stream may output the bytes representing the synchronization block and the set of values in a device dependent byte order.

For example, because the synchronization block primarily includes byte values (consisting of the nibbles previously described), the output stream may output the synchronization block one byte at a time. In another example, because values in the set of values may include multiple bytes, the output stream may output the set of values according to a size of each respective value.

In one example, a system operating the output module 160 may be a Big-endian system, and the value may include two bytes (e.g., a word). As one skilled in the art may appreciate, a Big-endian system may store the most significant byte of a word in the smallest address and the least significant byte in the largest address. Therefore, when operating on a Big-endian system, the output module 160 may output bytes for a word in a reverse order.

Similarly, a system operating the output module 160 may be a little-endian system and the value may include four bytes. As one skilled in the art may appreciate, a little-endian system may store the most significant byte of the four bytes in the largest address and may store the least significant byte of the four bytes in the smallest address. Therefore, when operating on a Little-endian system, the output module 160 may output bytes for the four bytes in order.

In another embodiment, the output module 160 may be concurrently outputting many sets of values. The generation module 140 may have generated a list of cached synchronization blocks while generating synchronization blocks for respective set of values. The output module 160, in one example embodiment, may output the list of cached synchronization blocks before outputting the respective synchronization blocks and sets of values for the many sets of values.

Figure 2:
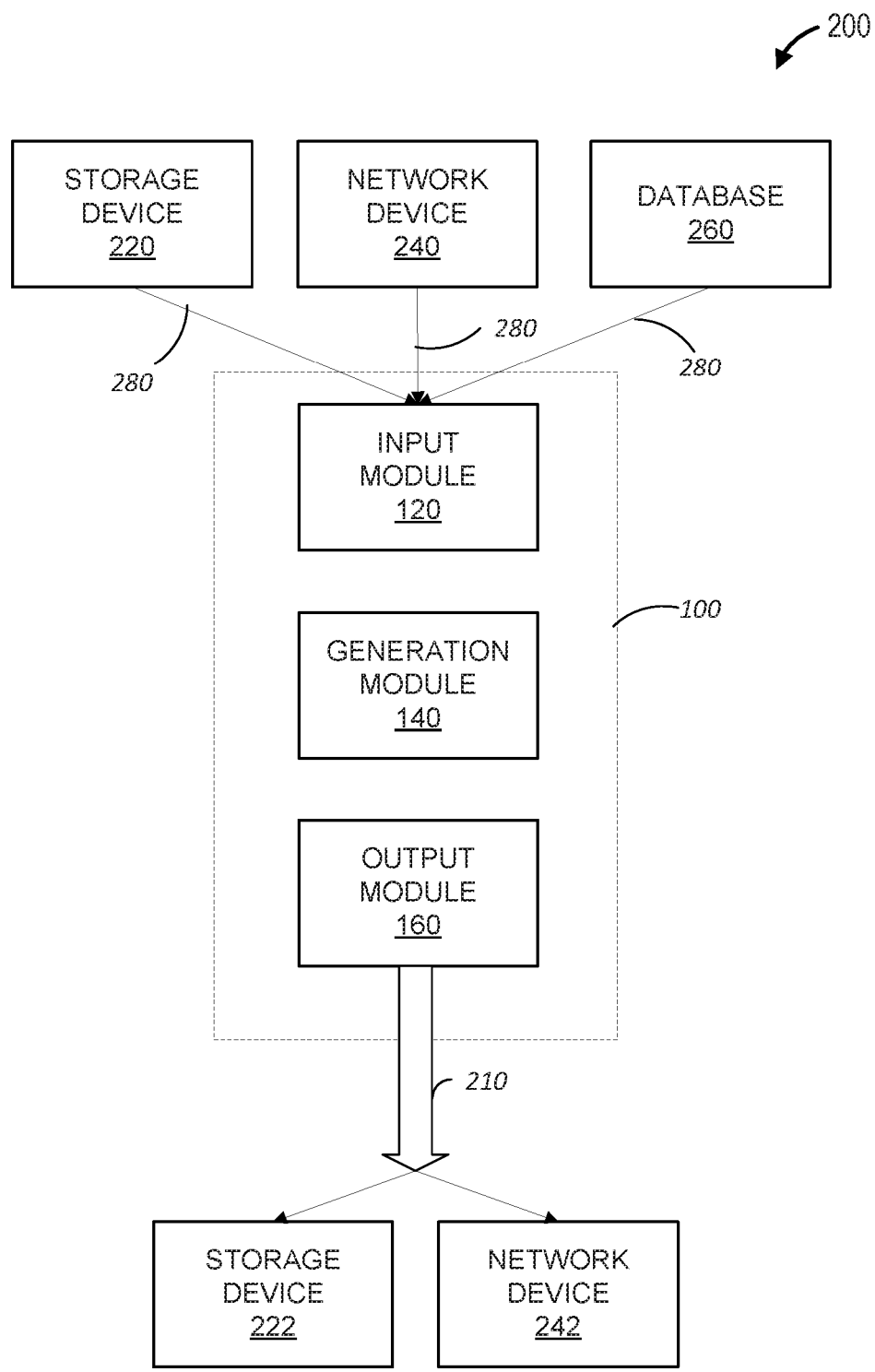
FIG. 2 is a block diagram illustrating a system for transforming character delimited values, in accordance with an example embodiment.

FIG. 2 is a block diagram illustrating a system 200 for transforming a character delimited value file, in accordance with an example embodiment. The system 200 may include a storage device 220, a network device 240, a database 260, the input module 120, the generation module 140, the output module 160, an output stream 210, a storage device 222, and a network device 242. The input module 120, the generation module 140, and the output module 160 may or may not be substantially similar to those modules depicted in FIG. 1.

In one embodiment, the input module 120 may receive a set of character delimited values in a text-based format. The input module 120 may receive the values from any of the storage device 220, the network device 240, and/or the database 260.

In one example, the input module 120 may receive character delimited values from a storage device 220. The storage device 220 includes a device capable of storing character delimited values on a computer readable storage medium as one skilled in the art may appreciate. Various examples include a hard drive, a flash drive, a compact disc, other forms of magnetic storage, other forms of electronic storage, other forms of physical storage, or other forms of storage or the like, as one skilled in the art may appreciate. The storage device 220 may include any to-be-developed storage medium.

Furthermore, the network device 240 may transmit the values to the input module 120 using any network protocol, transmission medium, or the like. Therefore, a connection 280 with the input module 120 may include a wired connection, a wireless connection, any network protocol, any network topology, or any other communication medium as one skilled in the art may appreciate, and this disclosure is not limited in this regard.

The input module 120 in another embodiment may receive character delimited values from the network device 240. In one example, the input module 120 may receive a stream of bytes representing the character delimited values over a network connection (e.g., connection 280). The stream of bytes may be substantially similar to a character delimited value file as one skilled in the art may appreciate. For example the stream of bytes may include a set of values delimited by a comma. Of course, the values may be deliminted by any character such as, but not limited to, a comma, a period, a semicolon, a colon, an asterisk, a letter, or other character, or the like. Delimiting characters may be selected from any character set, and this disclosure is not limited regarding the character used to divide values in the input stream. Furthermore, rows of values may be delimited by line ending characters such as, but not limited to, a "new line" (<LF>) character, a "carriage return" (<CR>) character, or other character, or the like.

In another embodiment, the input module 120 may receive a character delimited value file from the network device 240. As one skilled in the art may appreciate, the file may be transmitted using any currently known or to-be-developed file transmission protocol such as, but not limited to, file transfer protocol (FTP), torrent, network file system (NFS), SAMBA™, or the like. The character delimited value file may include many sets of values, and the input module 120 may process each set or row of values sequentially.

In another example, the input module 120 may receive character delimited values from the database 260. In one example, a structured query language (SQL) database may output values in a character delimited format to the input module 120. For example, results from an SQL query may result in many sets of data values, and the data values may be formatted in a character delimited stream of data representing the results of the query.

Also, the database 260 may dump values to the input module 120 in a character delimited format. In another example embodiment, the input module 120 may receive values from the database 260 over a network connection, over a direct connection, or the like. Of course, one skilled in the art may recognize other ways to export values in a database into a character delimited format and this disclosure is not limited in this regard.

After performing one or more operations on the received set or sets of values, the output module 160 may output resulting synchronization blocks and the values to a binary output data stream 210. The output data stream 210 may output the received data stream to a wide variety of destinations and may do so in a device dependent byte order according to respective byte sizes of the values, as will be described in later examples.

In one example, the binary output data stream 210 may output received bytes to a storage device 222 in a device dependent byte order for storage as a file. In certain embodiments, destination files may coordinate with source files. For example, the input module 120 may read a file from the storage device 220, and the output data stream 210 may store a transformation of the file to the storage device 222. In response to reading 10 different files from the source storage device 220, the output data stream 210 may then store 10 different transformed files at the storage device 222. Of course, this is not necessarily the case, as the output module 160 may combine values from many files to a single destination file, or other file, or the like. In other examples, the storage device 222 may include volatile memory, non-volatile memory, or other, or to-be-developed storage technologies, and this disclosure is meant to include all such storage mediums.

In another example, the binary output data stream 210 may output received bytes to the network device 242. The binary output data stream 210 may output received bytes in byte dependent order based, at least in part, on architecture for a device operating the output module 160. In another example, the binary output data stream 210 may output received bytes in a device dependent byte order based, at least in part, on architecture for a destination device. In another embodiment, the output module 160 may output the synchronization block and the set of values to the network device 242 through the binary output data stream 210 using any network protocol, transmission medium, or the like.

Figure 3:
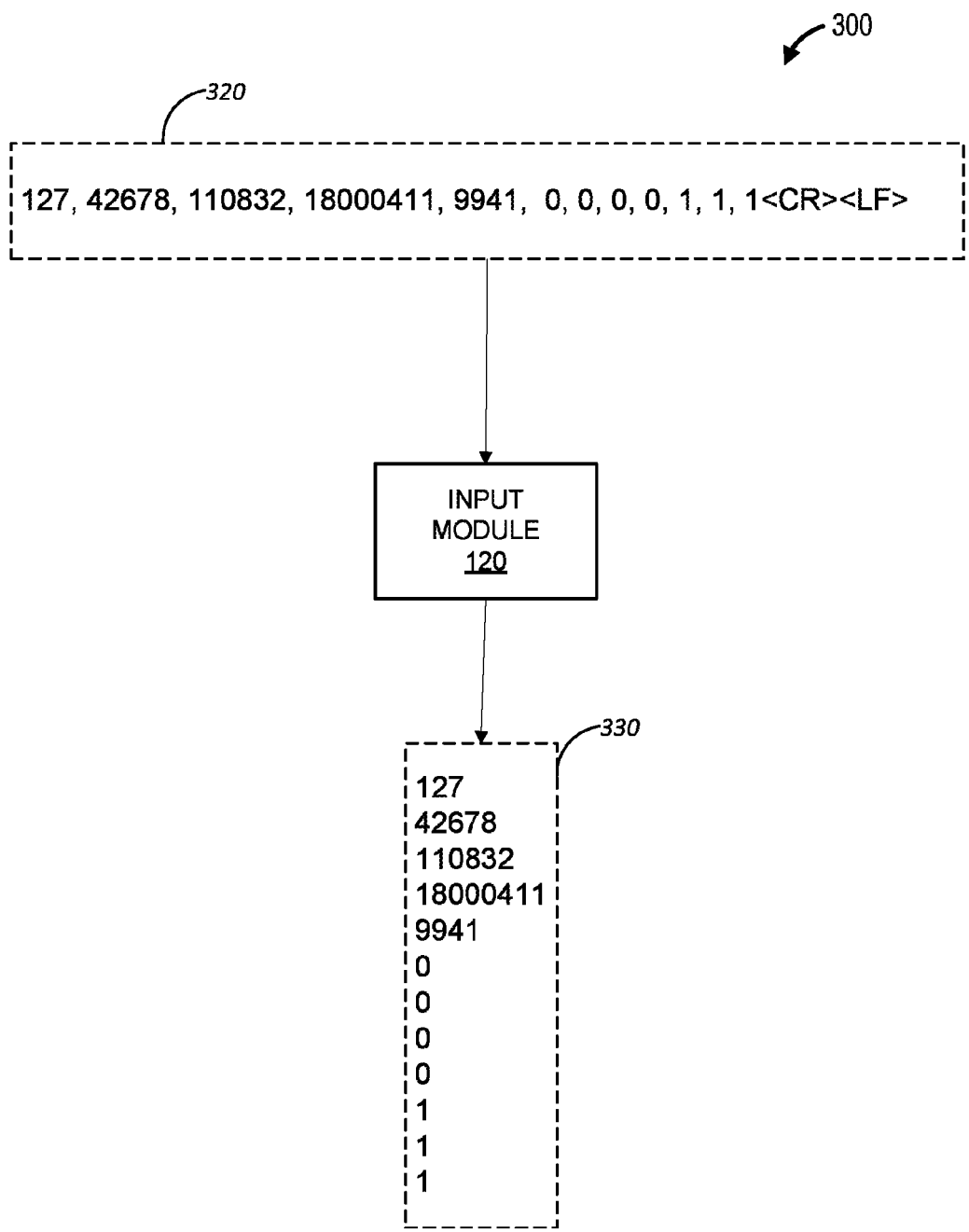
FIG. 3 is an illustration depicting one step in transforming character delimited values, in accordance with an example embodiment.

FIG. 3 is an illustration depicting one step in transforming character delimited values, in accordance with an example embodiment. In this example embodiment, the input module 120 may receive a string of values 320 that includes many comma delimited values. The input module 120 may receive, from a user, the delimiting character, which is a comma in this example.

The string of values 320 may represent a row of values in a character delimited value file. In this example, the string of values 320 concludes with a carriage return (<CR>) character and a new line or line feed (<LF>) character.

The input module 120 may parse the string of values 320 by reading the string of values 320 one character at a time until a delimiting character is read. After a delimiting character is read, the input module 120 may convert the received numbers into a value, as one skilled in the art may appreciate. The input module 120 may repeat this process of reading values between delimiters until the <CR> and the <LF> characters are read. Of course, other characters may be used to indicate an end of the set of values, and this disclosure is not limited in this regard.

After converting the string of values 320 into their numeric equivalents of string literals, the input module 120 stores the values in an array, list, vector, or other structure. Therefore, the input module 120 converts the string of values 320 to a set of equivalent numeric values 330 and prepares the set for processing by the generation module 140.

Figure 4:
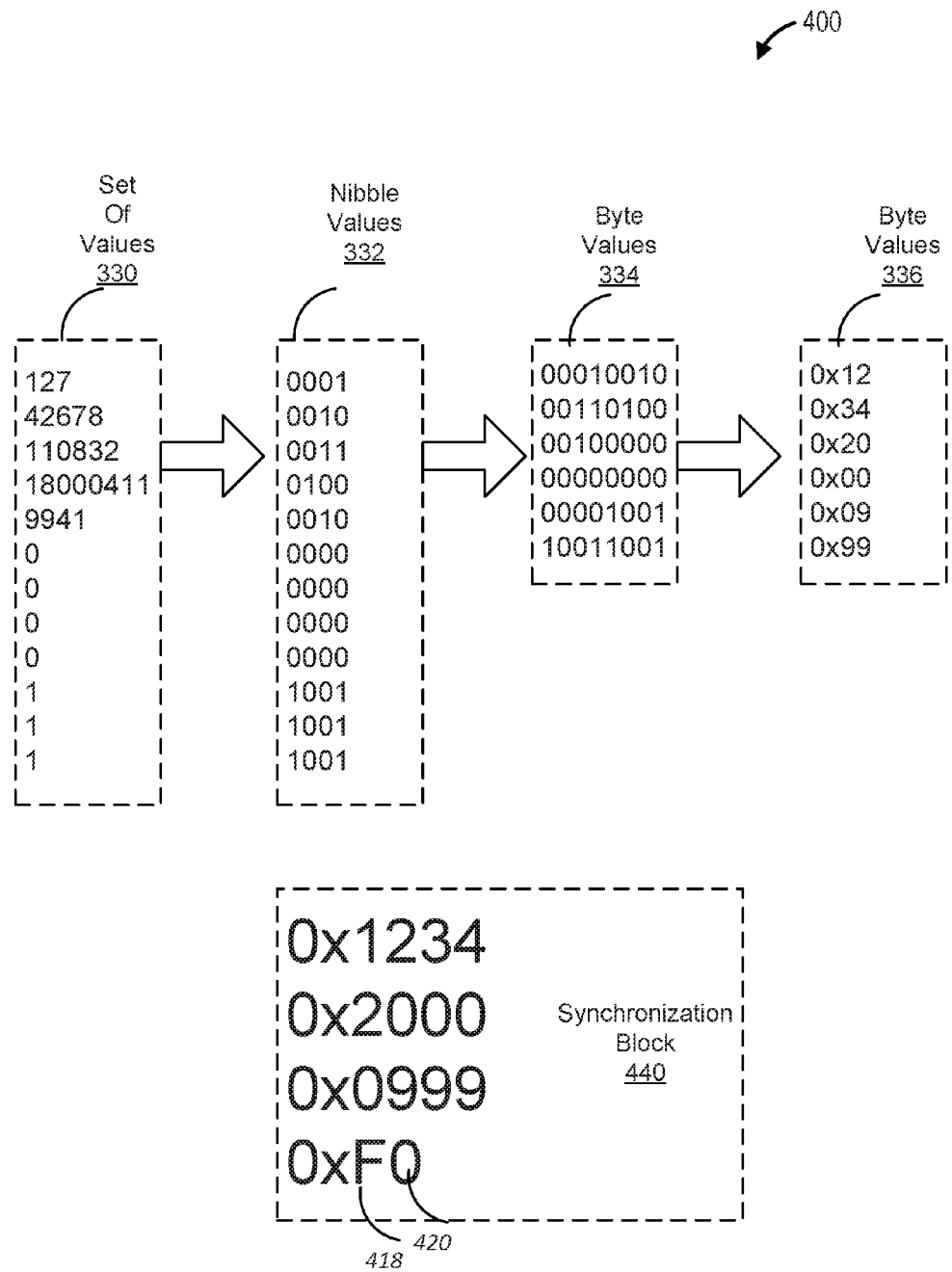
FIG. 4 is an illustration depicting one step in transforming character delimited values, in accordance with an example embodiment.

FIG. 4 is an illustration depicting one step 400 in transforming character delimited values, in accordance with an example embodiment. The generation module 140 may read the set of values and may determine a byte size requirement for storing each of the values.

In one example, the values may include positive values and the byte storage ranges may be as follows: one byte for values between 0 and 256, two bytes for values 256 to 65,536, four bytes for values between 65,536 and 4,294,967,295 ($2^{32}-1$). In another examples, values in the set of values 330 may include negative values, and the byte storage ranges may be as follows: one byte for values from −8 to 7, two bytes for values from −32768 to 32,767 (excluding −8 to 7), and four bytes for values from −2,147,483,648 to 2,147,483,647 ($2^{32}$−1) (excluding values from values from −32768 to 32,767).

In one example embodiment, the generation module 140 may determine a nibble for each of the values in the set of values 330. For example, because the first value of 127 may be represented using one byte, the generation module 140 may assign a nibble of 1 ($0001_2$). Because the second value of 42,678 may be represented using two bytes, the generation module 140 may assign a nibble of 2 ($0010_2$). Because the third value of 111,832 may be represented using three bytes, the generation module 140 may assign a nibble of 3 ($0011_2$). Because the fourth value of 18,000,411 may be represented using four bytes, the generation module 140 may assign a nibble of 4 ($0100_2$). Because the fifth value of 9,941 may be represented using two bytes, the generation module 140 may assign a nibble of 2 ($0010_2$).

Regarding the sixth value of 0, the generation module 140 may assign a nibble of zero ($0000_2$). A nibble of zero may be a predetermined flag that indicates that the corresponding value in the set of values is zero. Because the nibble of zero represents a predetermined value, the corresponding value of zero may not be stored in the set of values, as will be later described. Of course, the predetermined flag of zero may represent other values, and this disclosure is not limited in this regard.

Continuing with the set of values 330, the generation module 140 may represent the seventh through ninth values using a predetermined value of zero as done with the sixth value. The generation module 140 may use a predetermined value of 9 ($1001_2$) to represent the tenth through the twelfth values. A predetermined flag of 9, in this example embodiment, represents that the values are the same as with a preceding set of values. For example, because a previous set of values included a value of 1 in the tenth through the twelfth indexes, the generation module 140 may use the predetermined flag of 9 to represent the values. Of course, the predetermined flag may represent other values and this disclosure is not limited in this regard. Accordingly, the generation module 140 may generate a nibble for each of the values in the set of values 330, resulting in a set of nibbles 332.

After generating a set of nibbles 332 for the values in the set of values 330, the generation module 140 may combine the nibbles 332 into bytes by pairing up nibbles 332. For example, the nibbles 332 for the first ($0001_2$) and second (10102) values may be combined, resulting in a byte value 334 of $00011001_2$. Accordingly, the generation module 140 may combine nibbles 332 for $3^{rd}$ and $4^{th}$ ($00110100_2$), $5^{th}$ and $6^{th}$ ($00100000_2$), $7^{th}$ and $8^{th}$ ($00000000_2$), $9^{th}$ and $10^{th}$ ($00001001_2$), $11^{th}$ and $12^{th}$ ($10011001_2$). Pairing the nibbles 332 in this way results in a set of byte values 334 that represent the nibbles 332 for the respective sets of values 330.

The nibble pairings may also be represented in hexadecimal format as an array of byte values 336. The array of byte values 336 therefore represent nibbles 332 for each of the values in the set of values 330. As previously indicated, some of the nibbles 332 represent byte sizes of the respective values, and other nibbles 332 represent flags. In order to indicate an end of the nibbles 332, the generation module 140 may terminate the array of byte values 336 using a boundary nibble (0xF) 418. Also, because adding the boundary nibble 418 would result in an odd number (13) of nibbles, the generation module 140 may insert a filler nibble (0x0) 420 to ensure that the number of nibbles is even, resulting in adequate nibble pairing to equal a specific number of bytes in the synchronization block 440.

Figure 5:
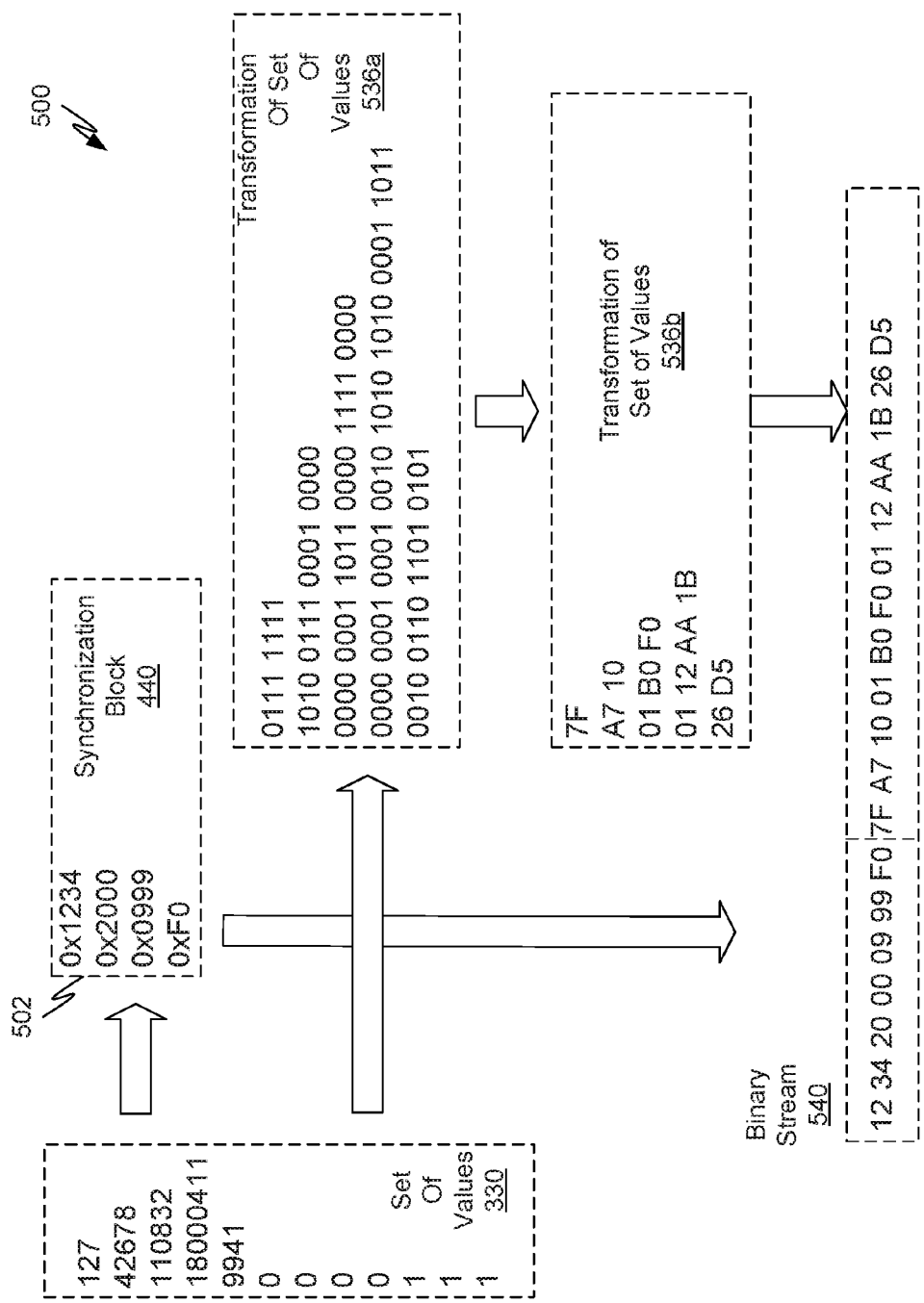
FIG. 5 is an illustration depicting one step in transforming character delimited values, in accordance with an example embodiment.

FIG. 5 is an illustration depicting one step in transforming character delimited values, in accordance with an example embodiment. In accordance with the present example embodiment, the generation module 140 may utilize the synchronization block 440 and the set of values 330 to generate a transformation 536 of the set of values 330.

The generation module 140 may begin at the first value (127) and may read the first nibble of the synchronization block 440 (0x1) to determine that the first value 127 is to be stored in one byte. The first byte in the transformation 536a for representing the first value (using a signed format) is $01111111_2$.

The generation module 140 may continue and read the second nibble in the synchronization block 440 (0x2) and determine that the second value in the set of values 330 is to be stored in two bytes. Accordingly, the second and third bytes in the transformation 536a for representing the second value (42,678) are 1010 0111 0001 $0000_2$.

The generation module 140 may continue and read the third nibble in the synchronization block 440 (0x3) and determine that the third value (110,832) in the set of values 330 is to be stored in three bytes. Accordingly, the $4^{th}$ through the $6^{th}$ bytes in the transformation 536a for representing the third value (110,832) are 0000 0001 1011 0000 1111 $0000_2$.

The generation module 140 may continue and read the fourth nibble (0x4) in the synchronization block 440 and determine that the fourth value (18,000,411) in the set of values 330 is to be stored in four bytes. Accordingly, the $7^{th}$ through $10^{th}$ bytes in the transformation 536a for representing the fourth value (18,000,411) are 0000 0001 0001 0010 1010 1010 0001 $1011_2$.

The generation module 140 may continue and read the fifth nibble (0x2) in the synchronization block 440 and determine that the value (9,941) in the set of values 330 is to be stored in two bytes. Accordingly, the $11^{th}$ and $12^{th}$ bytes in the transformation 536a for representing the fifth value (9,941) are 0010 0110 1101 $0101_2$.

The generation module 140 may continue and read the sixth nibble (0x0) in the synchronization block 440 and determine that sixth value is a predetermined value (0x0). In this example embodiment, a predetermined value of 0 is represented by a nibble of 0. Therefore, the sixth value is represented by the nibble in the synchronization block 440 and is not stored in the transformation 536a of values. This is similarly the case for the $7^{th}$, $8^{th}$, and $9^{th}$ values in the set of values 330.

The generation module 140 may continue and read the $10^{th}$ nibble (0x9) in the synchronization block 440 and determine that the tenth value is a predetermined value. In one example, because the nibble is greater than eight, it is determined to be a flag. In this example embodiment, a predetermined value of 9 indicates that the value in the set of values 330 is a predetermined value; a one in this example. Therefore, the generation module 140 may determine that the $10^{th}$ value in the set of values 330 is a predetermined value and it is not stored in the transformation 536a of values. This is similarly the case for the $11^{th}$ and $12^{th}$ values in the set of values 330. The transformation 536a may also be represented in a hexadecimal format (as shown in the transformed set of values 536b), as one skilled in the art may appreciate.

The generation module 140 may then combine the synchronization block 440 and the transformed set of values 536b to form an array of bytes in the binary stream 540 representing the set of values 330. In this example embodiment, the resulting array of bytes may be included in the binary stream 540 as follows: 0x12 34 20 00 09 99 F0 7F A7 10 01 B0 F0 01 12 AA 1B 26 D5. In this example embodiment, the resulting array of bytes for representing the set of values 330 includes 20 bytes whereas the original character delimited values 320 included at least 47 bytes.

In one embodiment, the output module 160 may output the binary stream 540 in a wide variety of different ways, as one skilled in the art may appreciate. The output module 160 may output the binary stream 540 in a device dependent format. For example, the output module 160 may reorder bytes in the binary stream 540 to support reading integers (4 bytes) at a time. In one example, the output module 160 may output the binary stream 540, as integers, for a Big-endian system, by storing bytes for the respective integers in reverse order such that a reading device may read the binary stream 540 four bytes at a time, resulting in the individual bytes being in the correct order. Of course, other byte sized reads may be used, and this disclosure is not limited in this regard. Furthermore, the output module 160 may, in certain embodiments, insert filler bytes in order to byte align one or more values. Byte aligning values in this may improves write speed for the output stream and also may improve read speed for the binary stream 540.

Figure 6:
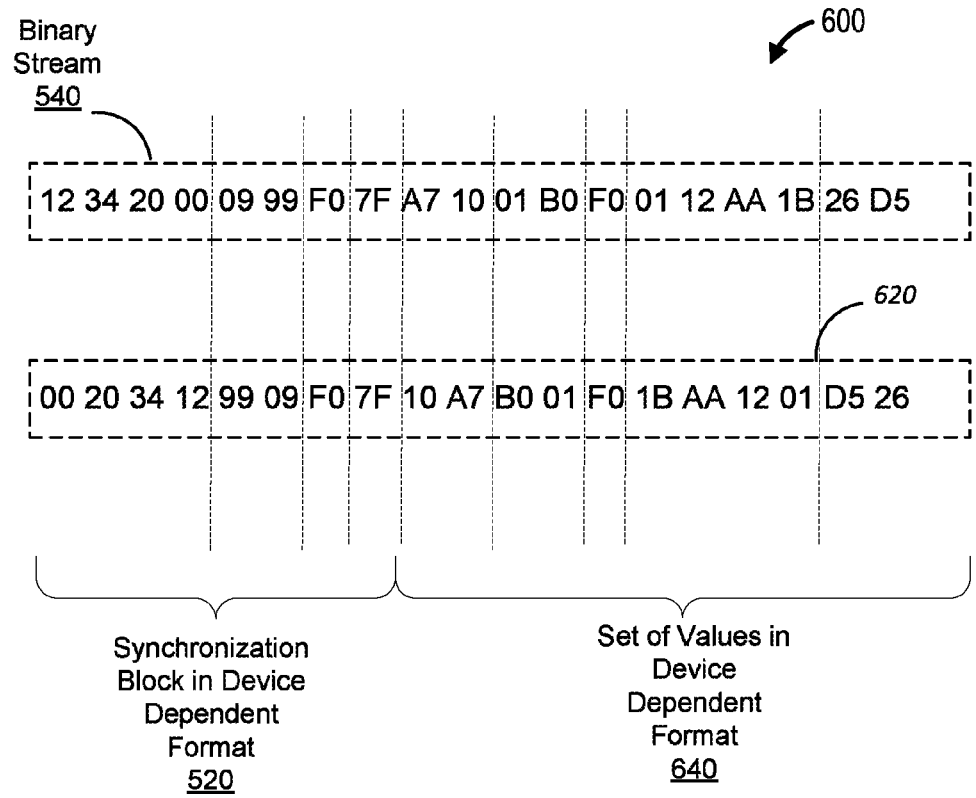
FIG. 6 is an illustration depicting one step in transforming character delimited values, in accordance with an example embodiment.

FIG. 6 is an illustration depicting one step 600 in transforming character delimited values, in accordance with an example embodiment. In accordance with the current example embodiment, the generation module 140 may have generated a binary stream 540. The output module 160 may output the binary stream 540 in a device dependent format 620 according to respective byte sizes of the one or more values.

According to one example embodiment, the output module 160 may reorder the first four bytes of the synchronization block 440 (0x12 0x34 0x30 0x00) according to a Big-endian format (reverse order) so that a reading system may read the four bytes in a single operation as an integer. In another example embodiment the output module 160 may output the synchronization block in byte order and may order bytes for the transformed set of values in a device-dependent byte order.

The output module 160 may continue and similarly order the next two bytes (0x09 0x99) of the synchronization block 440. The binary stream 540 may then output the transformed synchronization block 440. The output module 160 may determine, based on the corresponding nibble in the synchronization block 440, that the first value (0x7F) of the set of values 330 is represented by one byte and may write the first byte (0x7F). The output module 160 may then determine that the second value (0xA710) is represented by two bytes and may reorder the next two bytes, now as 0x10A7, so that the binary stream 540 may output the two bytes according to a two-byte data type, such as, but not limited to, a short integer, or other 16-bit data type.

The output module 160 may continue and determine that the next value includes three bytes (0x01 0xB0 0xF0). The output module 160 may output three bytes in a variety of different device-dependent ways. First, the output module 160 may divide the three bytes into two bytes (0x01 and 0xB0) and one byte (0xF0) as depicted in FIG. 6. The output module 160 may then reorder the first two bytes and output the third byte (0xF0) in a separate output operation. In another example (not depicted in FIG. 6), the output module 160 may output the first byte (0x01) in a separate operation and reorder the other two bytes (0xB0 and 0xF0). In another example (not depicted in FIG. 6), the output module 160 may insert a filler byte (0x00) and then may output the three bytes and the filler byte as four bytes in a single output operation. Of course, the output module 160 may still reorder the four bytes according to either a Big-endian or a Little-endian format as described and based on an architecture of a device performing the operations.

The output module 160 may then determine, based on the associated nibble in the synchronization block 440, that the next value (0x0112AA1B) includes four bytes and may reorder the four bytes (0x1BAA1201) according to a device dependent format 640 before outputting the four bytes via the binary stream 540. The output module 160 may then similarly determine that the next value (0x26 0xD5) includes two bytes and may reorder the two bytes (0xD5 0x26) according to a device dependent format 640.

In another example embodiment, the output module 160 may terminate the set of values by outputting a termination flag, such as 0xFF. Such a termination flag may indicate to a reading system that this particular set of values has ended.

Figure 7:
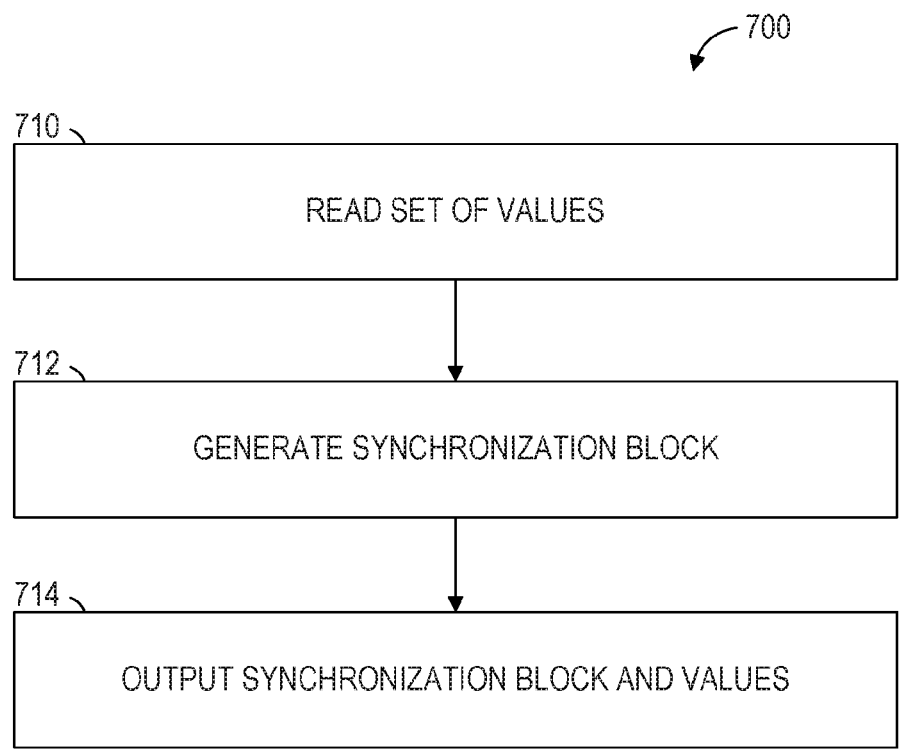
FIG. 7 is an illustration depicting a method for transforming character delimited values, in accordance with an example embodiment.

FIG. 7 is an illustration depicting a method 700 for transforming character delimited values, in accordance with an example embodiment. Operations in the method 700 may be performed by the system 100, using modules described above with respect to FIGS. 1-3. As shown in FIG. 7, the method 700 includes operations 710, 712, and 714.

In one embodiment, the method 700 may begin and at operation 710 the input module 120 may read a set of character delimited values (e.g., the set of values 330) in a text-based format. In another embodiment, the set of values may correspond to a row of values in a character delimited value file. The method 700 may continue at operation 712 and the generation module 140 may generate, in real-time, a synchronization block as described herein. The synchronization block includes nibbles (e.g., nibbles 332) for each of the values in the set of values read by the input module 120.

The method 700 may continue at operation 714 and the output module 160 may sequentially output the synchronization block and the one or more values to a binary output data stream (e.g., binary stream 540). The binary output data stream may output the one or more values in a device dependent byte order according to respective byte size of the one or more values.

Figure 8:
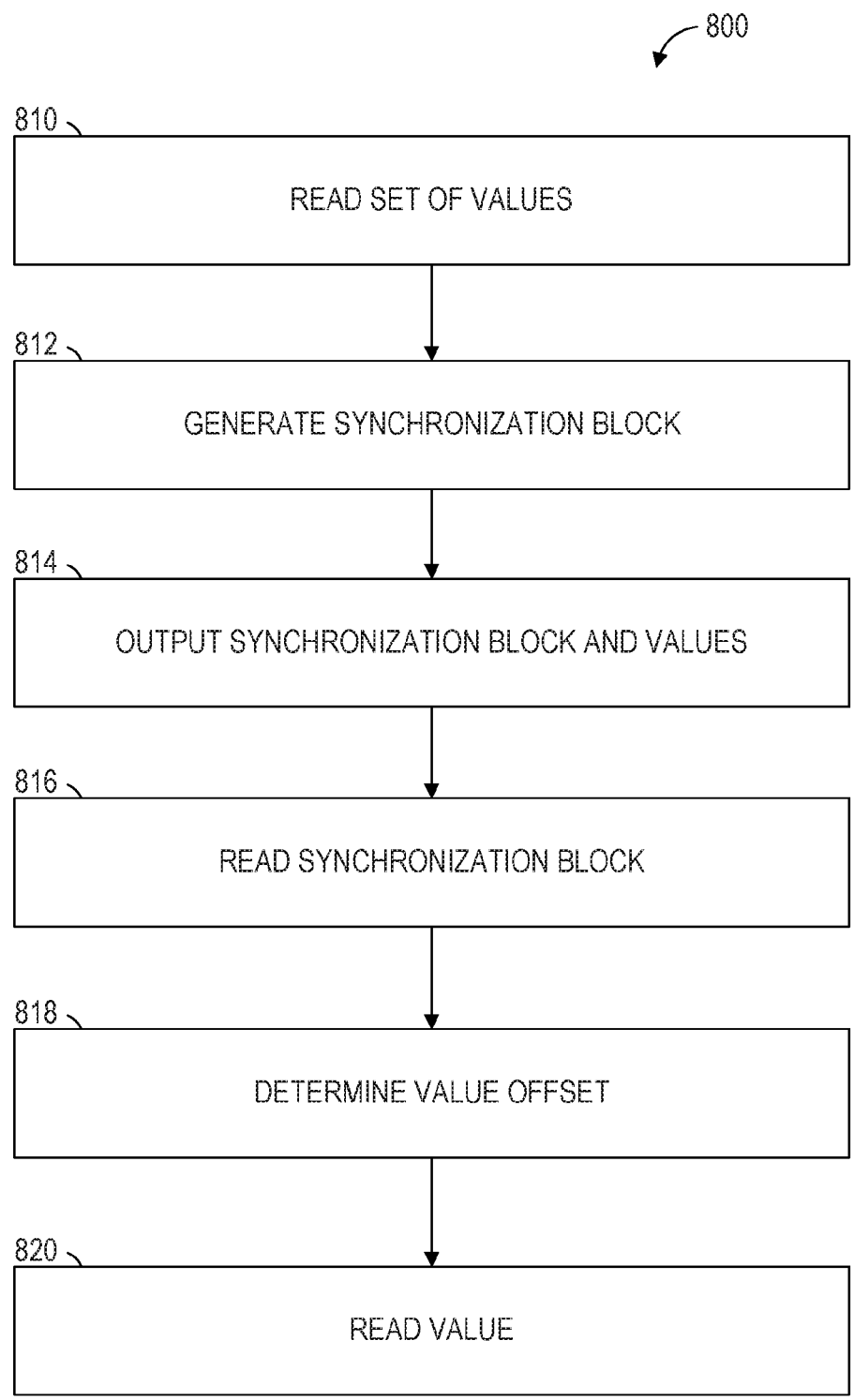
FIG. 8 is an illustration depicting a method for transforming character delimited values, in accordance with an example embodiment.

FIG. 8 is an illustration depicting a method 800 for transforming character delimited values, in accordance with an example embodiment. Operations in the method 800 may be performed by the system 100, using modules described above with respect to FIGS. 1-3. As shown in FIG. 8, the method 800 includes operations 810, 812, 814, 816, 818, and 820.

In one embodiment, the method 800 may begin and at operation 810 the input module 120 may read a set of character delimited values (e.g., the set of values 330) in a text-based format. In another embodiment, the set of values may correspond to a row of values in a character delimited value file. The method 800 may continue at operation 812 and the generation module 140 may generate, in real time, a synchronization block (e.g., synchronization block 440) as described herein. The synchronization block includes nibbles (e.g., nibbles 332) for each of the values in the set of values read by the input module 120.

The method 800 may continue at operation 814 and the output module 160 sequentially output the synchronization block and the one or more values to a binary output data stream. The binary output data stream may output the one or more values in a device dependent format (e.g., device dependent format 640) according to respective byte size of the one or more values.

The method 800 may continue at operation 816 and the input module 120 may read a synchronization block. In one embodiment, reading the synchronization block may include reading bytes from a stream of bytes until a boundary nibble is read. A boundary nibble indicates an end of the synchronization block and a beginning of values. In another embodiment, the input module 120 may read the synchronization block one byte at a time until the boundary nibble is read.

After reading the synchronization block, the input module 120 may determine value offsets for respective values in the set of values based on the values of the nibbles. For example, in response to the first nibble indicating that the first value includes one byte, the generation module 140 may read one byte. Based on the first nibble indicating that the first value includes two bytes, the input module 120 may read two bytes, etc. The input module 120 may accordingly read subsequent values from the stream of bytes based on indicated byte sizes in the nibbles in the synchronization block.

Furthermore, the input module 120 may determine an offset value for a value in the set of values. For example, the input module 120 may receive an index for a value included in the array of values. In response, the input module 120 may determine a number of bytes indicated before the indicated value, skip that number of bytes in the stream of bytes, and read the value at operation 820. Therefore, because the synchronization block indicates byte sizes of respective values, the input module 120 may determine an offset value for any of the values in the array and read the value. In this way, the synchronization block provides fast access to values in the array without having to read other values in the array.

Figure 9:
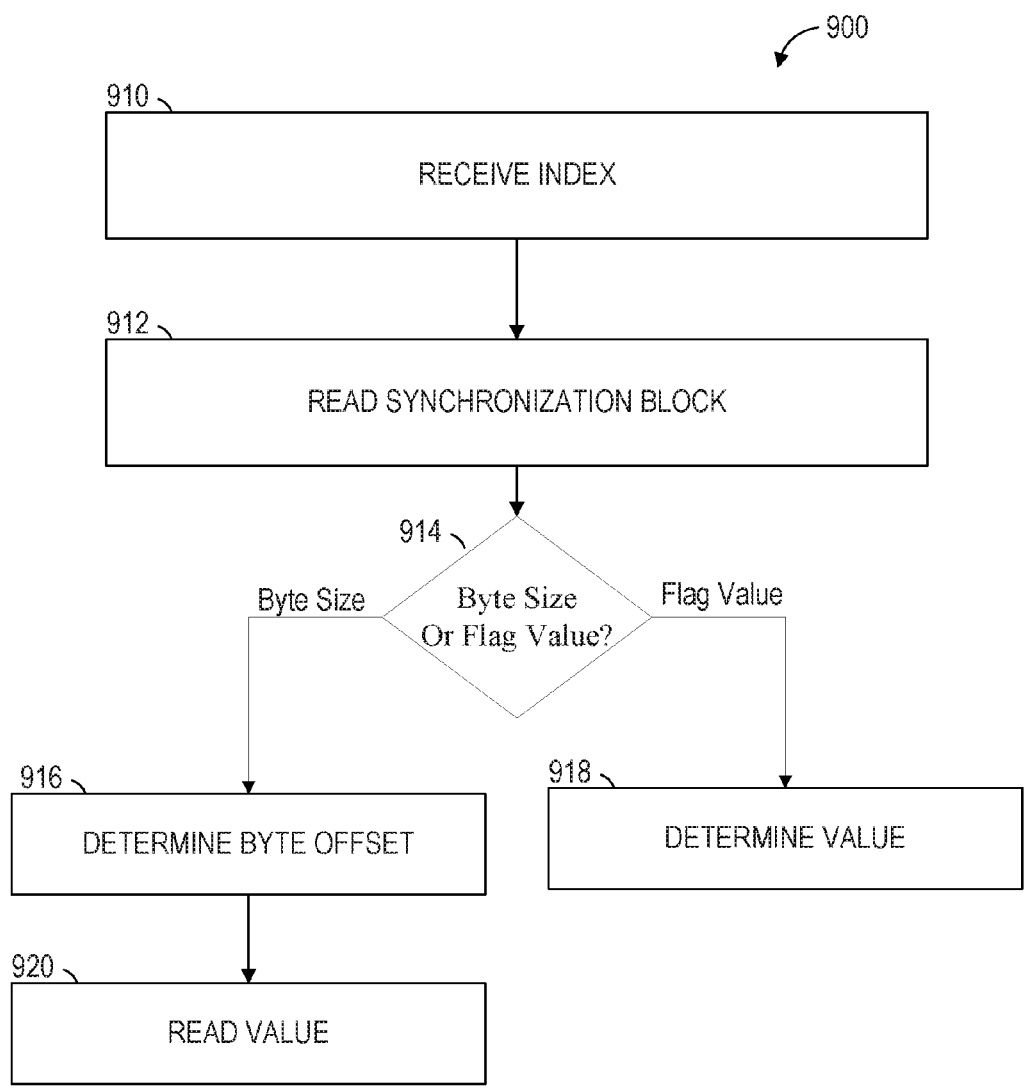
FIG. 9 is an illustration depicting a method for reading transformed character delimited values, in accordance with an example embodiment.

FIG. 9 is an illustration depicting a method 900 for reading values in transformed character delimited values, in accordance with an example embodiment. Operations in the method 900 may be performed by the system 100, using modules described above with respect to FIGS. 1-3. As shown in FIG. 9, the method 900 includes operations 910, 912, 914, 916, 918, and 920.

In one embodiment, the method 900 may begin and at operation 910 the input module 120 may receive an index for a value included in an array of values. The index indicates a position of the value in the array of values. For example, the index may be four, which indicates the fourth value in the array of values.

The method 900 may continue at operation 912 and the input module 120 may read the synchronization block. The method 900 may continue at operation 914 and the input module 120 may determine whether the nibble for the value in the synchronization block is a byte size or a flag. In response to the nibble indicating a byte size, the input module 120 may determine a byte offset for the value at operation 916.

In one example, the input module 120 may count byte sizes for preceding values to determine an offset. In another example, preceding values may include predetermined values. In this example, the input module 120 may not include the predetermined value in the offset calculation because the value is not stored in the set of values. The method may continue at operation 920 and the input module 120 may read the value based on the byte offset and the byte size.

In response to the nibble indicating a predetermined value, the input module 120 may determine that the value matches the predetermined value at operation 918. The predetermined value may be received from a user or other source. In another example, the predetermined value may be received before reading the synchronization block for the set of values.

Figure 10:
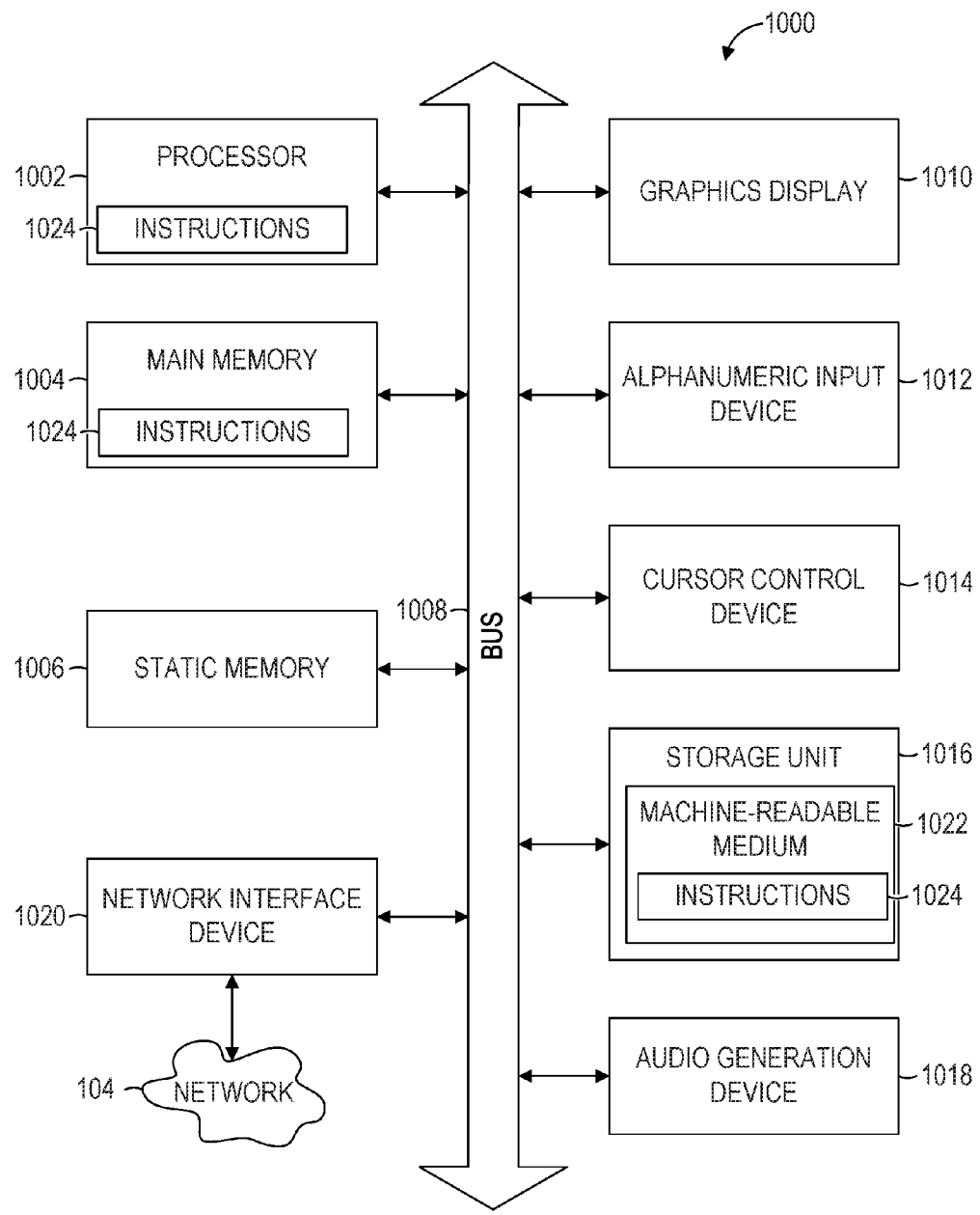
FIG. 10 is a block diagram illustrating components of a machine, according to some example embodiments, able to read instructions from a machine-readable medium and perform any one or more of the methodologies discussed herein.

FIG. 10 is a block diagram illustrating components of a machine 1000, according to some example embodiments, able to read instructions 1024 from a machine-readable medium 1022 (e.g., any of a non-transitory machine-readable medium, a machine-readable storage medium, a computer-readable storage medium, or any suitable combination thereof) and perform any one or more of the methodologies discussed herein, in whole or in part. Specifically, FIG. 10 shows the machine 1000 in the example form of a computer system (e.g., a computer) within which the instructions 1024 (e.g., software, a program, an application, an applet, an app, or other executable code) for causing the machine 1000 to perform any one or more of the methodologies discussed herein may be executed, in whole or in part. In one example embodiment, the input module 120, the generation module 140, and the output module 160 may be included in the instructions 1024.

In alternative embodiments, the machine 1000 may operate as a standalone device or may be connected (e.g., networked) to other machines. The input module 120, the generation module 140, and the output module 160 may operate via the machine 1000. In a networked deployment, the machine 1000 may operate in the capacity of a server machine or a client machine in a server-client network environment, or as a peer machine in a distributed (e.g., peer-to-peer) network environment. The machine 1000 may be a server computer, a client computer, a personal computer (PC), a tablet computer, a laptop computer, a netbook, a cellular telephone, a smartphone, a set-top box (STB), a personal digital assistant (PDA), a web appliance, a network router, a network switch, a network bridge, or any machine capable of executing the instructions 1024, sequentially or otherwise, that specify actions to be taken by that machine. Further, while only a single machine is illustrated, the term "machine" shall also be taken to include any collection of machines that individually or jointly execute the instructions 1024 to perform all or part of any one or more of the methodologies discussed herein. Therefore, in certain embodiments, the various modules described herein, may be executed on different machines operating as part of the system 100.

The machine 1000 includes a processor 1002 (e.g., a central processing unit (CPU), a graphics processing unit (GPU), a digital signal processor (DSP), an application specific integrated circuit (ASIC), a radio-frequency integrated circuit (RFIC), or any suitable combination thereof), a main memory 1004, and a static memory 1006, which are configured to communicate with each other via a bus 1008. The processor 1002 may contain microcircuits that are configurable, temporarily or permanently, by some or all of the instructions 1024 such that the processor 1002 is configurable to perform any one or more of the methodologies described herein, in whole or in part. For example, a set of one or more microcircuits of the processor 1002 may be configurable to execute one or more modules (e.g., software modules) described herein.

The machine 1000 may further include a graphics display 1010 (e.g., a plasma display panel (PDP), a light emitting diode (LED) display, a liquid crystal display (LCD), a projector, a cathode ray tube (CRT), or any other display capable of displaying graphics or video). The machine 1000 may also include an alphanumeric input device 1012 (e.g., a keyboard or keypad), a cursor control device 1014 (e.g., a mouse, a touchpad, a trackball, a joystick, a motion sensor, an eye tracking device, or other pointing instrument), a storage unit 1016, an audio generation device 1018 (e.g., a sound card, an amplifier, a speaker, a headphone jack, or any suitable combination thereof), and a network interface device 1020. The input module 120 may receive one or more predetermined values from the alphanumeric input device 1012, the cursor control device 1014, the storage unit 1016, or the like.

The storage unit 1016 includes the machine-readable medium 1022 on which are stored the instructions 1024 embodying any one or more of the methodologies or functions described herein. The instructions 1024 may also reside, completely or at least partially, within the main memory 1004, within the processor 1002 (e.g., within the processor's cache memory), or both, before or during execution thereof by the machine 1000. Accordingly, the main memory 1004 and the processor 1002 may be considered machine-readable media 1022 (e.g., tangible and non-transitory machine-readable media). The instructions 1024 may be transmitted or received over the network 104 via the network interface device 1020. For example, the network interface device 1020 may communicate the instructions 1024 using any one or more transfer protocols (e.g., hypertext transfer protocol (HTTP)).

In some example embodiments, the machine 1000 may be a portable computing device, such as a smart phone or tablet computer. Examples of such input components include an image input component (e.g., one or more cameras), an audio input component (e.g., a microphone), a direction input component (e.g., a compass), a location input component (e.g., a global positioning system (GPS) receiver), an orientation component (e.g., a gyroscope), a motion detection component (e.g., one or more accelerometers), an altitude detection component (e.g., an altimeter), and a gas detection component (e.g., a gas sensor). Inputs harvested by any one or more of these input components may be accessible and available for use by any of the modules described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute software modules (e.g., code stored or otherwise embodied on a machine-readable medium or in a transmission medium), hardware modules, or any suitable combination thereof. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, and such a tangible entity may be physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software (e.g., a software module) may accordingly configure one or more processors, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. As used herein, "processor-implemented module" refers to a hardware module in which the hardware includes one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network 104 (e.g., the Internet) and via one or more appropriate interfaces (e.g., an application program interface (API)).

In one embodiment, the input module 120 may receive one or more sets of character delimited characters via the network interface device 1020 communicating with the network 104. Furthermore, the output module 160 may output the binary output data stream via the network interface device 1020. In another embodiment, the input module 120 may read the set of character delimited values from the storage unit 1016 and/or the output module 160 may output the transformed binary data stream to the storage unit 1016. Therefore, in certain embodiments, the storage unit 1016 may include the storage device 220 and/or storage device 222 described in FIG. 2.

The performance of certain operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of the subject matter discussed herein may be presented in terms of algorithms or symbolic representations of operations on data stored as bits or binary digital signals within a machine memory (e.g., a computer memory). Such algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as processing," "computing." "calculating" "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non exclusive "or," unless specifically stated otherwise.

What is claimed is:

1. A computer system comprising:
a processor;
a memory device holding an instruction set executable on the processor to cause the computer system to perform operations comprising:
reading a set of character delimited values;
generating a synchronization block for the set of values, the synchronization block comprising, for each of the values of the set of values, at least one of a byte size of the corresponding value and a predetermined flag representing the corresponding value; and
outputting the synchronization block and the set of values to a binary output data stream in a device dependent byte order according to respective byte sizes of the values.

2. The computer system of claim 1, wherein one of the values in the set of values is a string and the corresponding byte size indicates a length of the string, the binary output data stream outputting the string in byte order.

3. The computer system of claim 1, wherein the synchronization block ends with a boundary value, the boundary value providing a boundary between the synchronization block and the set of values.

4. The computer system of claim 3, wherein the synchronization block further comprises a filler value in response to a number of values for the synchronization block being an odd number of values, the filler value positioned between the set of values and the boundary value.

5. The computer system of claim 1; wherein values of the set of values that are represented by a predetermined flag are not output with the set of values.

6. The computer system of claim 1, wherein one of the predetermined flags indicates that the corresponding value is a repeated value from a previous set of values, the value not output with the set of values.

7. The computer system of claim 1, wherein the synchronization block comprises an index into a set of cached synchronization blocks.

8. The computer system of claim 1, wherein the operations further comprise determining a value at a specified index in the set of values in the binary output data stream by:
reading the synchronization block to determine a byte offset identifying a location of the value; and
reading one or more bytes at the location in a device dependent order, the one or more bytes representing the value at the specified index.

9. A computer-implemented method comprising:
reading a set of character delimited values;
generating, a synchronization block for the set of values, the synchronization block comprising, for each value of the set of values, at least one of a byte size of the corresponding value and a predetermined flag representing the corresponding value; and
outputting the synchronization block and the set of values to a binary output data stream in a device dependent byte order according to respective byte sizes of the values.

10. The computer-implemented method of claim 9, wherein one of the values in the set of values is a string and the corresponding byte size indicates a length of the string, the binary output data stream outputting the string in byte order.

11. The computer-implemented method of claim 9, wherein the synchronization block ends with a boundary value, the boundary value providing a boundary between the synchronization block and the set of values.

12. The computer-implemented method of claim 11, wherein the synchronization block further comprises a filler value in response to a number of values for the synchronization block being an odd number of values, the filler value positioned between the set of values and the boundary value.

13. The computer-implemented method of claim 9, wherein values of the set of values that are represented by a predetermined flag are not output with the set of values.

14. The computer system of claim 9, wherein one of the predetermined flags indicates that the corresponding value is a repeated value from a previous set of values, the value not output with the set of values.

15. The computer-implemented method of claim 9, wherein the synchronization block comprises an index into a set of cached synchronization blocks.

16. The computer-implemented method of claim 9, further comprising determining a value at a specified index in the set of values in the binary output data stream by:
    reading the synchronization block to determine a byte offset identifying a location of the value; and
    reading one or more bytes at the location in a device dependent order, the one or more bytes representing the value at the specified index.

17. A computer-implemented method comprising:
    reading a set of character delimited values;
    generating, a synchronization block for the set of values, the synchronization block comprising, for each value of the set of values, at least one of a byte size of the corresponding value and a predetermined flag representing the corresponding value; and
    outputting the synchronization block and the set of values to a binary output data stream in a device dependent byte order according to respective byte sizes of the values.

18. The computer-implemented method of claim 17, wherein one of the values in the set of values is a string and the corresponding byte size indicates a length of the string, the binary output data stream outputting the string in byte order.

19. The computer system of claim 17, wherein the plurality of bytes comprises a predetermined flag that indicates the value.

20. The computer system of claim 17, wherein the synchronization block comprises a filler value and a boundary value, the filler value and the boundary value included in a byte that terminates the synchronization block.

\* \* \* \* \*